United States Patent [19]
Buchan et al.

[11] Patent Number: 5,373,166
[45] Date of Patent: Dec. 13, 1994

[54] MODULATED STRAIN HETEROSTRUCTURE LIGHT EMITTING DEVICE

[75] Inventors: Nicholas I. Buchan, Danbury, Conn.; Willi Heuberger, Richterswil; Peter Roentgen, Thalwil, both of Switzerland

[73] Assignee: International Business Machines Corporation, Armonk, N.Y.

[21] Appl. No.: 125,724

[22] Filed: Sep. 24, 1993

[30] Foreign Application Priority Data

Jan. 11, 1993 [EP] European Pat. Off. ........ 93810011.2

[51] Int. Cl.$^5$ ................ H01L 29/161; H01L 29/205; H01L 29/225
[52] U.S. Cl. ........................................ 257/18; 257/12; 257/96
[58] Field of Search .................. 257/12, 13, 18, 22, 257/85, 90, 96

[56] References Cited

U.S. PATENT DOCUMENTS

5,251,225 10/1993 Eglash et al. ................... 372/45

FOREIGN PATENT DOCUMENTS

4-346485 4/1993 Japan .

OTHER PUBLICATIONS

J. W. Matthews, et al., "Defects in Epitaxial Multilayers" Journal of Crystal Growth, 27, pp. 118–125, 1974.
S. Adachi, "Material Parameters of $In_{1-x}Ga_xAs_yP_{1-y}$ and related Binaries" J. Appl. Phys. 53 (12) pp. 8775–8792, Dec. 1982.
"Band–Structure Engineering for Low–Threshold High-Efficiency Semiconductor Lasers" Electronics Letters, vol. 22, No. 5 pp. 249–250, Feb. 27, 1986.
T. C. Chong, et al., "Theoretical Gain of Strained-Layer Semiconductor Lasers in the Large Strain Regime" IEEE Jrl. of Quantum Electronics, vol. 25, No. 2, pp. 171–178, Feb. 1989.
S. W. Corzine, et al., "Theoretical Gain in Compressive and Tensile Strained InGaAs/InGa AsP Quantum Wells" Appl. Phys. Lett. 59 (5) pp. 588–590, Jul. 1991.
A. Valster, et al., "Effect of Strain on the Threshold Current of GaInP/AlGaInP Quantum Well Lasers Emitting at 633 nm" Proc. 13th IEEE Int. Semiconductor Laser Conference, Japan, pp. 152–153, Sep., 1992.
P. J. A. Thijs, "Progress in Quantum Well Lasers: Application of Strain" Proc. 13th IEEE Int. Semiconductor Laser Conf., Japan, pp. 2–5, Sep. 1992.
P. J. A. Thijs, et al., "Low–pressure MOVPE Growth and Characterization of Strained-Layer InGaAs-InGaAsP Quantum Well Lasers" Microelectronic Engineering, Elsevier, vol. 18, pp. 57–74, 1992.
Landolt-Bornstein, "Numerical Data & Functional Relationships in Science & Technology" Group III: Crystal & Solid State Physics, vol. 22, Semiconductors, Supplements & Extensions to V. III/17, Sub.vol#a, Berlin, Chapter 2.16.3.
H. Kawanishi, et al., "Low threshold current density of GaInAsP visible injection laser diodes lattice matched with (100) GaAs emitting at 705 nm" J. Appl. Physics, V. 58, (1), pp. 37–39, Jul. 1985.
T. C. Chong, et al., "Theoretical Gain of Strained-Layer Semiconductor Lasers in the Large Strain Regime" IEEE Journal of Quantum Electronics, V. 25, No. 2, pp. 171–178, Feb. 1989.
M. Joma, et al., "High-power 1.48$\mu$ multiple quantum well lasers with strained quaternary wells entirely grown by metalorganic vapor phase epitaxy" Appl. Phys. Lett, V. 58, (20), pp. 2220–2222, May 1991.
B. I. Miller, et al., "Strain–compensated strained-layer superlatices for 1.5 $\mu$m wavelength lasers" Appl. Phys. Lett. V. 58 (18), pp. 1952–1954, May 6, 1991.
C. P. Seltzer, et al., "Zero-Net-Strain Multiquantum Well Lasers" Electronics Letters, V. 27, No. 14, pp. 1268–1269, Jul. 4, 1991.

*Primary Examiner*—Jerome Jackson
*Assistant Examiner*—Nathan Kelley
*Attorney, Agent, or Firm*—H. Daniel Schnurmann

[57] ABSTRACT

A heterostructure laser diode is provided with an active region that includes a ternary or quaternary semiconductor compound. The composition of the semiconductor compound forming the active region is modulated resulting in an active region with a modulated strain profile ($\Delta a/a$), e.g., a triangular sawtooth-like strain profile, perpendicular to the laser diodes epitaxial layers, i.e., parallel to the z-axis. This permits the present invention to increase strain and avoid formation of misfit dislocations by compensation, i.e., by inserting strained layers having opposing strains.

17 Claims, 5 Drawing Sheets

MODULATED STRAIN HETEROSTRUCTURE LIGHT EMITTING DEVICE

TECHNICAL FIELD

The invention relates to semiconductor light emitting devices such as light emitting diodes and laser diodes, and in particular, to heterostructure diodes, having an active region with a modulated strain profile.

BACKGROUND OF THE INVENTION

Most semiconductor laser diodes available nowadays are double-heterostructure laser diodes. The manufacture of these heterostructure diodes is simpler and, thus, better understood when it is compared to the more complex quantum-well laser diodes. It also guarantees higher yields.

The present invention relates to an improved heterostructure diode that only requires slight modifications to an existing manufacturing process, This is clearly preferable to starting a new manufacturing process and accepting risks of unknown reliability. Prior to switching from a conventional double-heterostructure laser diode to a quantum well laser diode, the intermediate step towards an improved heterostructure diode is deemed to be adequate for most manufacturers.

Single-Heterostructure diodes (SH) and Double-Heterostructure diodes (DH) will, henceforth, be addressed independently of their material, structure, and layer configuration. Details on Single-Heterostructure and Double-Heterostructure laser diodes and light emitting diodes are provided in Chapter 12, 'LED and Semiconductor Lasers' in the book "Physics of Semiconductor Devices", S. M. Sze, Second Edition, John Wiley & Sons, New York, 1981.

OBJECTS OF THE INVENTION

Accordingly, it is an object of the present invention to provide an improved heterostructure semiconductor laser diode or light emitting diode.

It is another object of the present invention to provide for a heterostructure laser diode having a reduced threshold current.

It is a further object of the present invention to provide a heterostructure laser diode with increased differential gain.

It is yet another object of the present invention to provide an improved heterostructure laser diode or light emitting diode with minimum modifications, such that the manufacturing can be carried out using existing manufacturing processes.

SUMMARY OF THE INVENTION

These and other objects of the invention are accomplished in accordance with the present invention by providing a heterostructure laser diode or light emitting diode with an active region that includes alternating compressive and tensile strained sublayers of quaternary semiconductor compounds, stacked on top of each other, resulting in an active region with a modulated strain profile perpendicular to the laser diode epitaxial layers. The net layer strain of this active region can either be zero or shifted towards a compressive or tensile strain, e.g., by providing the laser diode with a modulated strain profile and an adjustable net layer strain. It is thus shown how to increase strain and avoid the formation of misfit dislocations by compensation, i.e., by inserting strained layers with opposing strains.

BRIEF DESCRIPTION OF THE DRAWINGS

The foregoing and other objects, features and advantages of the invention will be apparent from the following, more particular description of %he present invention, as illustrated in the accompanying drawings, in which.

The drawings are schematic diagrams not drawn to scale. More particularly, the dimensions of some parts are exaggerated for the sake of clarity.

DESCRIPTION OF THE PREFERRED EMBODIMENTS

Heterostructure diodes are characterized in that a potential barrier is introduced either on one side (Single-Heterostructure) or on both sides (Double-Heterostructure) of the diode active region. A typical Single-Heterostructure (SH) diode is described in "Physics of Semiconductor Devices", S. M. Sze, Second Edition, John Wiley & Sons, New York, 1981, cf. FIG. 27, page 709. It includes a p-doped GaAs active region embedded between an n-doped GaAs cladding layer and a p-doped AlGaAs cladding layer. This SH is characterized by a homojunction on one side, i.e., the junction between the p-doped GaAs active region and the n-doped GaAs cladding layer, and a heterojunction, i.e., the junction between the p-doped GaAs active region and the p-doped AlGaAs cladding, on the other side. This heterojunction provides the previously mentioned potential barrier. In addition, a step of the refractive index of the order of a few percent leads to better confinement of the light on this side of the active region.

Figure 1:
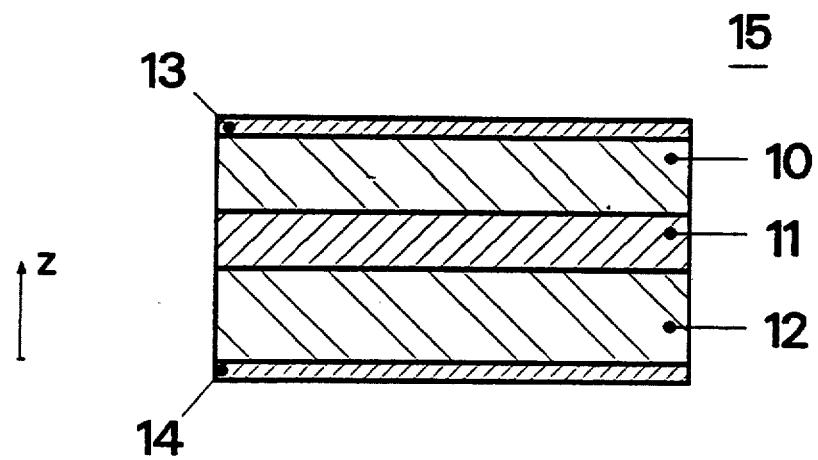
FIG. 1 shows a simplified cross-section of a prior art broad area heterostructure semiconductor laser diode.
Figure 2:
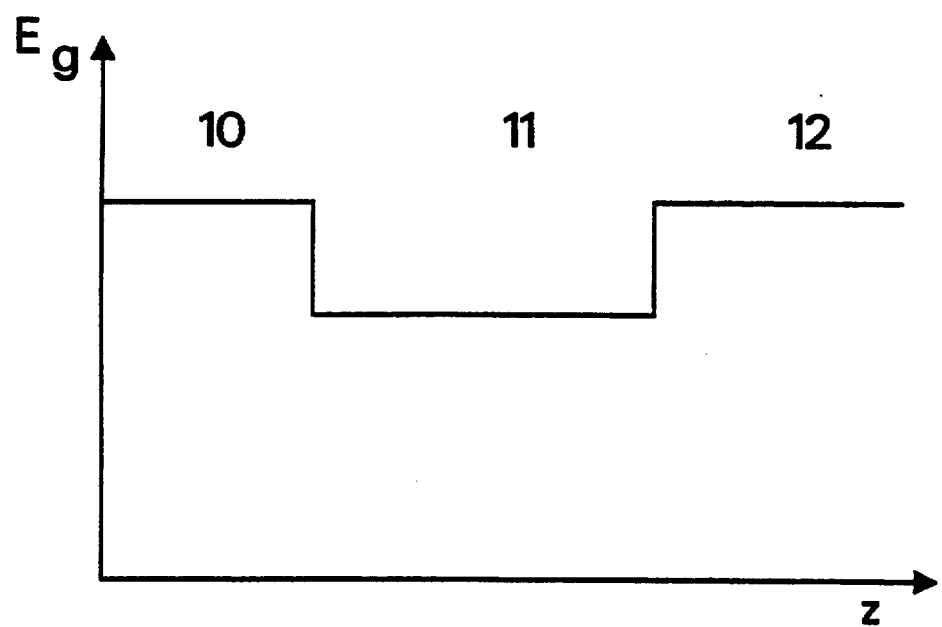
FIG. 2 shows a bandgap ($E_g$) diagram of a prior art Double-Heterostructure (DH) laser diode.

In Double-Heterostructure laser diodes, which were the first diodes to be operated continuously at room temperature, the recombination and the optical field are confined to an active region by the introduction of a second potential barrier to the Single-Heterostructure. A cross-sectional view of a prior art broad area Double-Heterostructure laser diode 15 is shown in FIG. 1. A similar structure is set out in FIGS. 26 and 27, on pp. 708–709, of the above-mentioned book of S. M. Sze. The laser diode 15 consists of an active region 11 that includes preferably p-doped GaAs, an upper cladding layer 10 and a lower cladding layer 12. The upper cladding layer 10 consists preferably of p-doped AlGaAs and a lower cladding layer of n-doped AlGaAs. Additionally, the laser 15 has contact metallizations 13 and 14. The bandgap ($E_g$) profile of this laser 15 is illustrated in FIG. 2. As can be seen from this drawing, the active region 11 is embedded between two potential barriers provided by cladding layers 10 and 12. One disadvantage of such a conventional heterostructure laser diode lies in its relative high threshold current ($I_{th}$).

The band structure theory anticipates reduced threshold current densities ($J_{th}$) for quantum-well and heterostructure InP-based lasers containing compressive strained InGaAsP active regions, as reported in the article: "Band Structure Engineering for Low Threshold High-Efficiency Semiconductor Lasers", by A. R. Adams, Electronics Letters, Vol. 22, No. 5, February 1986, pp. 249–250. Originally, only a compressive strain was considered for enhancing the laser performance, as disclosed in the above-mentioned study by A. R. Adams. However, an even more reduced threshold current arises from InP based laser diodes with highly tensile strained InGaAsP active region. This is confirmed by T. C. Chong et al. in the article: "Theoretical Gain of Strained-Layer Semiconductor Lasers in the Large Strain Regime", IEEE Journal of Quantum Electronics, Vol. 25, No. 2, February 1989, pp. 171–178.

Fundamentally, the strain perturbs the valence band structure of the semiconductor, such as InGaAsP, so as to decrease the in-plane hole mass and the density of states near the valence band edge. This results in a reduction of carrier loss mechanisms, such as Auger recombination, and increases the differential gain of the laser. On the other hand, an intermediate tensile strain is predicted to increase $J_{th}$ due to valence band maxima outside the zone center, which encourage additional losses due to indirect transitions, as described in the article: "Theoretical Gain in Compressive and Tensile Strained InGaAs/InGaAsP Quantum Wells", by S. W. Corzine et al., Applied Physics Letters, Vol. 59, No. 5, July 1991, pp. 588–590.

Figure 3:
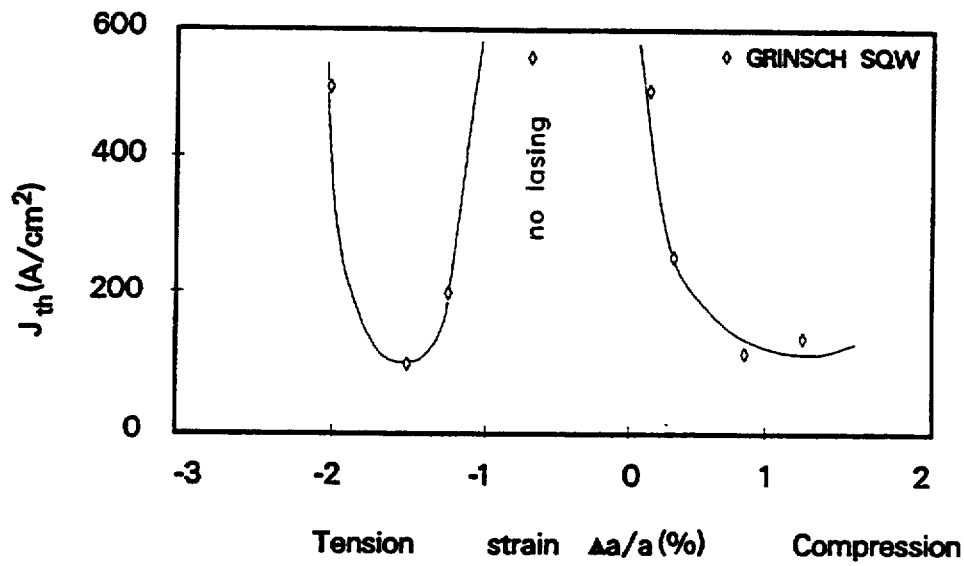
FIG. 3 shows the threshold current density ($J_{th}$) per Quantum Well (QW) versus stress ($\Delta a/a$) in a Single Quantum Well (SQW) laser diode, as described in the article: "Low-Pressure MOVPE Growth and Characterization of Strained-Layer InGaAs-InGaAsP Quantum Well Lasers", by P. J. A. Thijs et al., Microelectronic Engineering, Elsevier, Vol. 18, 1992, pp. 57-74.

The dependency between strain and threshold current density ($J_{th}$), is reported in the article: "Low-Pressure MOVPE Growth and Characterization of Strained-Layer InGaAs-InGaAsP Quantum Well Lasers", by P. J. A. Thijs et al., Microelectronic Engineering, Elsevier, Vol. 18, 1992, pp. 57–74, and in "Progress in Quantum Well Lasers: Application of Strain", P. J. A. Thijs, Proc. 13th IEEE Int. Semiconductor Laser Conference, 21–25 September 1992, Takamatsu, Kagawa, Japan, paper A-1, pp. 2–5. This dependency is illustrated in FIG. 3. In it are shown the threshold current densities extrapolated for infinite cavity length Single-Quantum-Well (SQW) lasers plotted versus strain ($\Delta a/a$) in the well. The variations of the threshold current densities are ascribed to the strain and the quantum size effects on the valence subband structure. Theory predicts that the threshold current density is independent of the quantum well width. A dramatically reduced threshold current density for both increasing tensile and compressive strain can be observed. The lowest threshold current density was obtained from a 1.6% tensile strained $In_{0.3}Ga_{0.7}TAs$ SQW structure which has a lattice constant a=0,5775 nm. The sharply increased threshold current density for the 2.1% tensile strained SQW structure arises most probably from crystallographic defects. No lasing at room temperature was observed for a QW laser diode with a tensile strain of about 0.9%. Comparable effects have also been reported for InGaAlP visible lasers in the article: "Effect of Strain on the Threshold Current of GaInP/AlGaInP Quantum Well Lasers Emitting at 633 nm", by A. Valster et al., Proc. 13th IEEE Int. Semiconductor Laser Conference, 21–25 September 1992, Takamatsu, Kagawa, Japan, paper G-1, pp. 152–153.

Under increasing compressive strain, the threshold current density decreases due to the reduction of the in-plane heavy hole effective mass and a reduction of the loss mechanisms, as already mentioned. As shown in FIG. 3, the threshold current density ($J_{th}$) is found to decrease monotonically for compressive as well as tensile strain, in the range of $0\% < \Delta a/a < 1.5\%$ and $-0.9\% < \Delta a/a < -1.6\%$, respectively.

Figure 4:
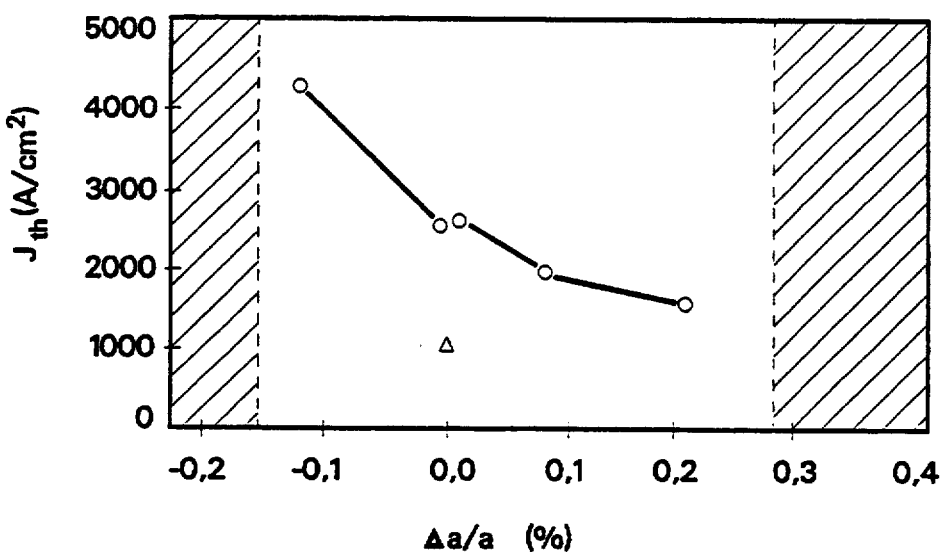
FIG. 4 shows the threshold current density ($J_{th}$) versus active layer strain ($\Delta a/a$) for broad area 1,3 $\mu$m wavelength InGaAsP-InP DH lasers with uniform strain (circles) of the present work.

In the case of compressive strain, it has been demonstrated that similar trends exist for broad area 1.3 μm wavelength InGaAsP-InP Double-Heterostructure (DH) lasers. $J_{th}$ of these structures (identified by circles) decreases monotonically with compressive strain, but strongly increases for the moderate tensile strain, as shown in FIG. 4. The trends shown in FIGS. 3 and 4 indicate that an even higher compressive and/or tensile strain in the active region should further decrease $J_{th}$. However, further improvements of $J_{th}$ in these DH structures cannot be achieved with a higher strain because misfit dislocations are generated in the structure when exceeding the critical layer thickness. In the particular case of a GaInAsP layer thickness of 120 nm (1200 A %), the maximum strain value is found to be $-0.14\% < \Delta a/a < +0.28\%$ indicated by the hatched regions in FIG. 4. These values were determined from estimates provided in: "Defects in Epitaxial Multilayers", J. W. Matthews et al., Journal of Crystal Growth, Vol. 27, 1974, pp. 118–125. Alternatively, the versatility of most quaternary materials as well as other semiconductor material with more than four components, such as AlGaAsP, AlGaInP, InGaAsP, ZnCdSSe, Cu(AlGa)(SSe), ZnSiP, and AlGaInSb, just to name a few, allows for the independent adjustment of the bandgap and stress, and allows for different embodiments of the present invention, three of which will be described hereinafter. The teaching of the present invention and the hereinafter described embodiments relating to laser diodes can also be advantageously used in light emitting diodes. Details on the different materials being well suited for the application of the present invention are described in:

"Heterostructure Lasers", H. C. Casey, Jr., and M. B. Panish, Academic Press, Inc. Orlando, 1978, Part B, 'Materials and Operating Characteristics';

"Material Parameters of $In_{1-x}Ga_xAs_yP_{1-y}$ and Related Binaries", S. Adachi, Journal of Applied Physics, Vol. 53, No. 12, December 1982, pp. 8775-8792;

Landolt-Boernstein, "Numerical Data and Functional Relationships in Science and Technology", Group III: Crystal and Solid State Physics, Vol. 22, Semiconductors, Supplements and Extensions to Volume III/17, Subvolume a, Springer Verlag, Berlin, in particular chapter 2.16.3.

Figure 5:
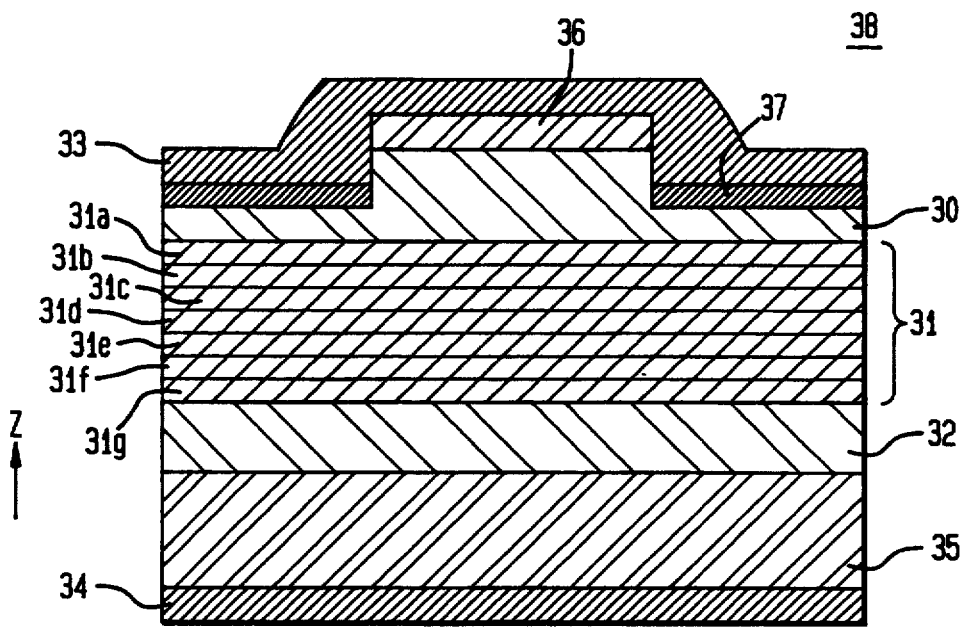
FIG. 5 shows a simplified cross-section of an InGaAsP-InP stripe-geometry Double-Heterostructure semiconductor laser diode, the thickness of the layers being scaled up, in accordance with a first embodiment of the present invention.

Referring now to the several embodiments of the present invention, the first embodiment is described in connection with FIGS. 5 and 6. The layers of the laser diode 38 are not drawn to scale. Some of the dimensions are scaled in order to show all the details. A stripe-geometry InGaAsP laser diode 38 emitting at 1.3 μm with double-heterostructure is shown in FIG. 5. This laser diode 38 includes different epitaxial layers subsequently grown on top of an n+ −doped InP substrate 35, i.e., an n-doped InP lower cladding layer 32, followed by an undoped InGaAsP active region 31, and a p-doped InP upper cladding layer 30 which has been etched to form a shallow ridge. As indicated in FIG. 5, the active layer 31 comprises several sublayers 31a-31g. The ridge itself is covered by a p+ −doped InGaAs cap layer 36. The remaining surfaces of the upper cladding layer 30 are covered by an insulation layer 37 consisting of $Si_3N_4$. Contact metallizations 33 and 34 are positioned on both sides of the laser diode 38.

Figure 6A:
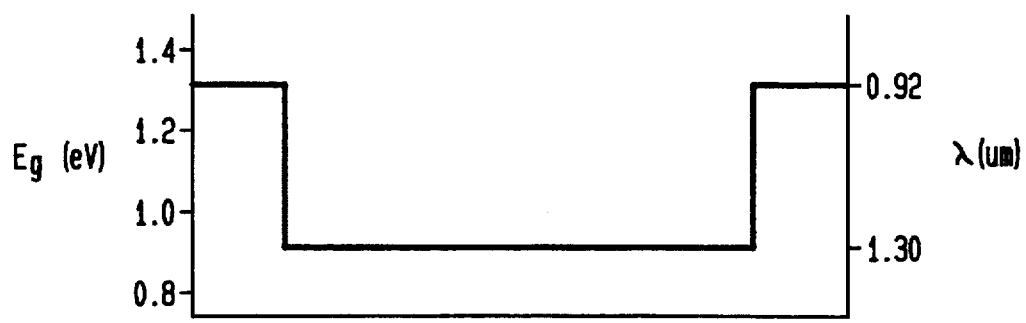
FIG. 6A and 6B show the bandgap ($E_g$) profile of the InGaAsP-InP DH laser diode of FIG. 5, and a triangular sawtooth-like strain ($\Delta a/a$) profile resulting from compositional variation in the laser's active region, in accordance with a first embodiment of the present invention.
Figure 6B:
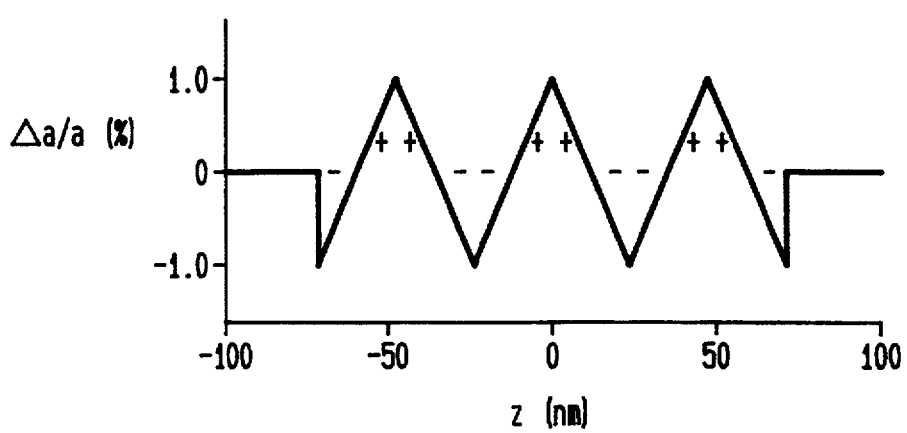
Figure 7:
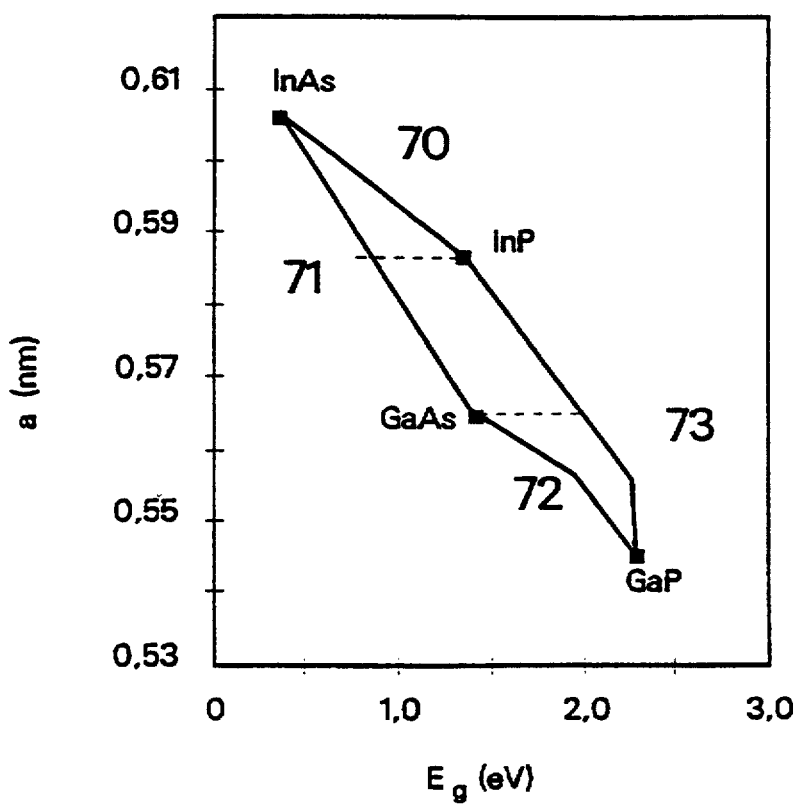
FIG. 7 shows the bandgap ($E_g$) profile and lattice constant (a) of the $In_{1-x}Ga_xAs_yP_{1-y}$ solid solution.

As shown in FIG. 6, the bandgap ($E_g$) of the active region 31, as a function of z, is about 0.95 eV ($=\lambda \approx 1.3$ μm), the InP cladding layers 30 and 32, with $E_g = 1.35$ eV ($=\lambda \approx 918$ nm), providing for potential barriers at both sides of the active region 31. According to the invention, the active region 31 comprises strained sublayers 31a-31g, providing for a modulated strain profile perpendicular to the epitaxial layers of the laser 38, i.e., parallel to the z-axis shown in FIG. 5. This modulated strain profile is illustrated in FIG. 6. The lattice constant of the InGaAsP active region 31 is a function of z (a=f(z)). The lattice constant can be modified by varying or modulating the composition of InGaAsP, (i.e., the so-called solid solution). The composition of compound semiconductors, such as InGaAsP, is usually indicated by indices x and y. Generally, quaternary compounds can be written as $A_{1-x}B_xC_yD_{1-y}$, InGaAsP being known as $In_{1-x}Ga_xAs_yP_{1-y}$. As with other solutions, the properties such as the bandgap and lattice constant of a solid solution depend on the composition of the components. A typical diagram, showing the bandgap ($E_g$) versus lattice constant (a) of $In_{1-x}Ga_xAs_yP_{1-y}$, is shown in FIG. 7. This simplified diagram has been extracted from the previously mentioned reference by H. C. Casey, Jr., and M. B. Panish, cf. FIG. 5.1-2 thereof. The border lines 70-73 represent the following ternary compounds: In $As_uP_{1-y}$ (70), $In_{1-x}Ga_xAs$ (71), Ga $As_yP_{1-y}$ (72), $In_{1-x}Ga_xP$ (73).

The binary compounds InP, InAs, GaAs and GaP are placed at cross-points of these border lines.

The lattice constant (a) of the active region can be varied without influencing the bandgap, as shown in FIG. 6, by subsequently growing InGaAsP sublayers 31a-31g having a different composition. The bandgap ($E_g$ in eV) and lattice constant (a in nm) as functions of x and y are defined by equations (1) and (2), respectively.

$$E_g(x,y) = 1.35 + 0.668y + 0.758x^2 + 0.078y^2 - 0.069x y - 0.322x^2 y + 0.03xy^2 \tag{1}$$

and $$a(x,y) = 0.58688 - 0.04176x + 0.01896y + 0.00125xy \tag{2}$$

With these equations, it is possible to generate a first matrix giving the bandgap ($E_g$ in eV) as a function of x and y, and a second matrix showing the dependency between the lattice constant (a in nm) of this quaternary compound and the indices x and y. As can be seen from these matrices, as well as from three-dimensional figures known in the art, cf. FIG. 5.5-5 on page 39 of H. C. Casey, Jr., and M. B. Panish, different compositions of InGaAsP exist having approximately the same bandgap, either with a tensile or a compressive strain.

In the present case, a sawtooth-like strain profile has been realized by varying the InGaAsP composition of the active region 31. In the first embodiment this modulated strain profile is created by ramping (i.e., rapidly varying) the composition of the InGaAsP solid solution from $In_{0.5}Ga_{0.5}As_{0.8}P_{0.2}$, a compound having a lattice constant of about 0.58167 nm, to $In_{0.95}Ga_{0.05}As_{0.4}P_{0.6}$, a compound having a lattice constant of about 0.5924 nm. These $In_{0.5}Ga_{0.5}As_{0.8}P_{0.2}$ sublayers 31a, 31c, 31e, and 31g (lattice constant a=0.58167 nm) have a maximum lattice mismatch (Δa/a) of −0.9% when they are grown on a binary InP substrate (a=0.587 nm) resulting in a tensile strain. The $In_{0.95}Ga_{0.05}As_{0.4}P_{0.6}$ sublayers 31b, 31d, and 31f are compressively strained with a maximum lattice mismatch of +0.9% (lattice constant a=0.5924 nm). The sawtooth-like strain profile shown in FIG. 6, is characterized in that the net layer strain, i.e., the total strain of the active region 31 is ±0%. This can be achieved by the sublayers 31a, 31c, 31e, and 31g with tensile strain compensate the sublayers 31b, 31d, and 31f with a compressive strain, as indicated by the '+' and '−' signs in FIG. 6. More details of the first embodiment are illustrated in Table 1.

TABLE 1

Illustrative example of the first embodiment

| Layer | No. | Material | Doping (cm$^{-3}$) | Width (nm) | Bandgap (eV) | Δa/a (%) |
|---|---|---|---|---|---|---|
| substrate | 35 | InP | 6 × 10$^{18}$(n) | 10$^5$ | 1.35 | n.a. |
| cladding | 32 | InP | 1 × 10$^{18}$(n) | 1500 | 1.35 | 0 |
| active region | 31 | $In_{1-x}Ga_xAs_yP_{1-y}$ | — | 150 | 0.95 | −0,9 — +0,9 modulated |
| cladding | 30 | InP | 1 × 10$^{18}$(p) | 1500 | 1.35 | 0 |
| cap layer | 36 | $In_{0.5}Ga_{0.5}As$ | 2 × 10$^{19}$(p) | 500 | 0.75 | 0 |

Figure 8:
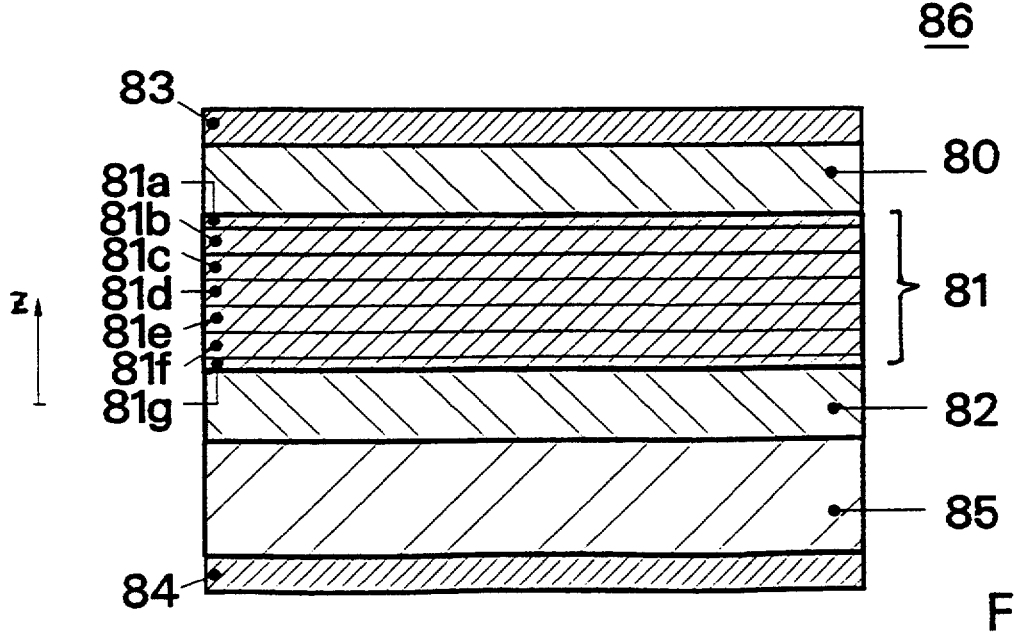
FIG. 8 shows a simplified cross-section of a broad area InGaAsP-InP DH laser diode, the thickness of the layers being scaled up, in accordance with a second embodiment of the present invention.

In a second embodiment of the present invention, a broad area DH laser diode 86 with modulated strain profile, is illustrated in FIG. 8. The layers of the laser diode 86 are not drawn to scale. Some of the dimensions have been scaled up in order to show all the details. This laser diode 86 includes a quaternary InGaAsP active region 81 with rectangular sawtooth-like strain profile parallel to the z-axis. This active region 81 is embedded in between a lower n-doped InP cladding layer 82 and an upper p-doped InP cladding layer 80. The active region 81 with cladding 80 and 82, is grown on top of an InP substrate 85 being n-doped. Contact metallizations 83 and 84 are positioned on both sides of this broad area laser diode 86.

Figure 9:
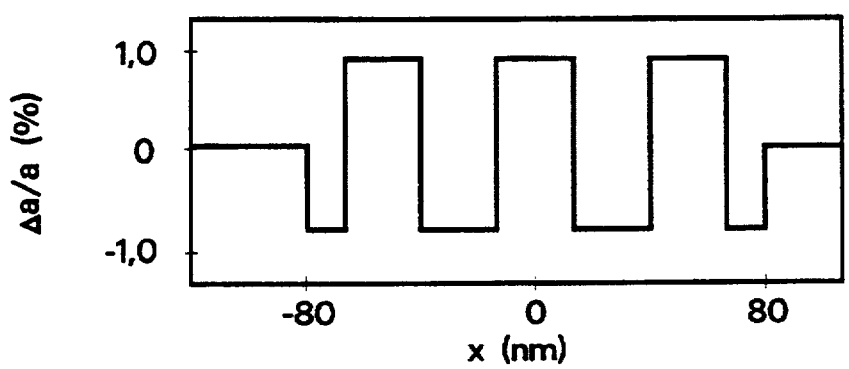
FIG. 9 shows the rectangular sawtooth-like strain ($\Delta a/a$) profile of the InGaAsP-InP DH laser diode of FIG. 8, in accordance with a second embodiment of the present invention.

The rectangular sawtooth-like strain profile perpendicular to the laser diode layers, i.e., parallel to the z-axis, is plotted in FIG. 9. As shown in this figure, the active region 81 comprises four $In_{0.55}Ga_{0.45}As_{0.75}P_{0.25}$ sublayers 81a, 81c, 81e, and 81g with tensile strain ($\Delta a/a = -0.73\%$) and three $In_{0.95}Ga_{0.05}As_{0.4}P_{0.6}$ sublayers 81b, 81d, and 81f with compressive strain ($\Delta a/a = 0.91\%$). Similar to the first embodiment, the bandgap of active region 81 is approximately constant, namely, $\approx 1$ eV. The thickness of the sublayers 81a–81g is chosen such that the stress of the compressive strained sublayers 81b, 81d, and 81f compensates the strain of the tensile strained sublayers 81a, 81c, 81e, and 81g, providing for an active region 81 with net layer strain $\Delta a/a = \pm 0\%$. The second embodiment differs from the first in that it includes no sublayers with intermediate tensile strain. Additionally, no ramping is necessary from one composition to another. More details of the second embodiment are set out in Table 2.

TABLE 2

| | | Illustrative example of the second embodiment | | | | |
|---|---|---|---|---|---|---|
| Layer | No. | Material | Doping (cm$^{-3}$) | Width (nm) | Bandgap (eV) | $\Delta a/a$ (%) |
| substrate | 85 | InP | $3 \times 10^{18}$(p) | $10^5$ | 1.35 | n.a. |
| cladding | 22 | InP | $1 \times 10^{18}$(p) | 2000 | 1.35 | 0 |
| active region | 81 | $In_{1-x}Ga_xAs_yP_{1-y}$ | — | 160 | 1 | −0.73 — +0.9 modulated |
| cladding | 80 | InP | $1 \times 10^{18}$(n) | 2000 | 1.35 | 0 |

Figure 10:
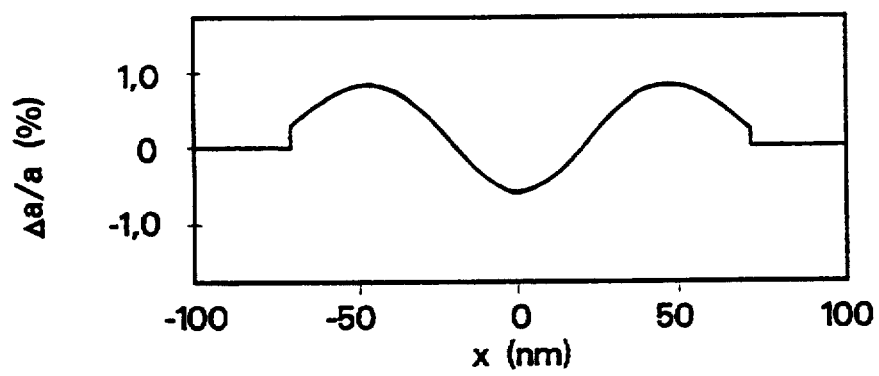
FIG. 10 shows the sinusoidal strain ($\Delta a/a$) profile of a DH laser diode, the net layer strain being shifted towards compressive strain, in accordance with a third embodiment of the present invention.

The modulated stress profile of a third embodiment, e.g., having a sinusoidal or cosinusoidal strain profile, is illustrated in FIG. 10. This modulated strain profile is characterized in that the net layer strain is shifted towards compressive strain, i.e., $\Delta a/a > 0\%$.

The above structures have been tested and have shown a strongly improved threshold current density ($J_{th}$) in comparison to conventional DH laser diodes either totally unstressed, or strained compressively, or under tensile strain. The reduction in threshold current density is about 25% and demonstrates a significant improvement of the modulated strain profile heterostructure lasers. In addition, strain modulated heterostructure lasers, SH laser as well as DH lasers, are characterized by an increase of 70% in differential gain leading to an about 30% higher modulation speed.

The bandgap is not required to be constant. The InGaAsP and other compound semiconductor systems provide a degree of freedom allowing to adjust the bandgap almost independently from the lattice constants. Embodiments are conceivable having a modulated strain profile and bandgap. Furthermore, the modulated strain profile does not even have to be an aperiodic function or an analytical function all together. To realize the previously mentioned embodiments, a growth process is required which allows spatial compositional variations leading to an appropriate modulated strain profile in a controlled environment. Suitable processes include MOVPE, MBE, CBE or VPE.

While the invention has been particularly shown and described with reference to the preferred embodiments thereof, it will be understood by those skilled in the art that the various changes in the form and detail may be made without departing from the spirit and scope of the invention.

What is claimed is:

1. A heterostructure semiconductor laser diode comprising:
    a quaternary semiconductor compound active region comprised of sublayers stacked on top of each other, said sublayers being strained alternatively in a compressive and tensile mode;
    upper and lower cladding layers with at least one of said cladding layers providing a potential barrier, said active region being embedded between said cladding layers;
    wherein said sublayers provide said active region with a modulated strain profile which is perpendicular to said region;
    and wherein said active region further comprises at least one compressively strained sublayer and one tensile strained sublayer, said active region having a net strain approximately equal to zero.

2. The heterostructure semiconductor laser diode as recited in claim 1, wherein said modulated strain of said active region is attained by varying the composition of said quaternary semiconductor compound of said active region.

3. The heterostructure semiconductor laser diode as recited in claim 2, wherein variations in composition in each of said sublayers stresses said sublayers to be alternatively in a compressive mode and in a tensile mode, thereby providing said active region with a sawtooth-like strain profile perpendicular to said active region.

4. The heterostructure semiconductor laser diode as recited in claim 2, wherein variations in composition in each of said sublayers stresses said sublayers to be alternatively in a compressive mode and in a tensile mode, thereby providing said active region with a sinusoidal strain profile perpendicular to said active region.

5. The heterostructure semiconductor laser diode as recited in claim 2, wherein variations in composition in each of said sublayers stresses said sublayers to be alternatively in a compressive mode and in a tensile mode, thereby providing said active region with a cosinusoidal strain profile perpendicular to said active region.

6. The heterostructure semiconductor laser diode as recited in claim 2, wherein variations in composition in each of said sublayers stresses said sublayers to be alternatively in a compressive mode and in a tensile mode, thereby providing said active region with a aperiodic strain profile perpendicular to said active region.

7. The heterostructure semiconductor laser diode as recited in claim 2, wherein variations in composition in each of said sublayers stresses said sublayers to be alternatively in a and in a tensile mode, thereby providing said active region with a non-analytical strain profile perpendicular to said active region.

8. The heterostructure semiconductor laser diode as recited in claim 1, further comprising an n-doped InP cladding layer and a p-doped cladding layer embedding said active region, said active region further comprising undoped or slightly doped $In_{1-y}Ga_yAs_yP_{1-y}$ sublayers.

9. The heterostructure semiconductor laser diode as recited in claim 8, wherein said sublayers further comprise a sublayer of $In_{0.55}Ga_{0.45}As_{0.75}P_{0.25}$ under tensile strain and $In_{0.95}Ga_{0.05}As_{0.4}P_{0.6}$ under compressive strain.

10. The heterostructure semiconductor laser diode as recited in claim 8, wherein the composition of said $In_{1-y}Ga_yAs_yP_{1-y}$ sublayers in said active region is $In_{0.5}Ga_{0.5}As_{0.8}P_{0.2}$ is said sublayers under tensile strain and $In_{0.95}Ga_{0.05}As_{0.4}P_{0.6}$ in said sublayers under compressive strain.

11. The heterostructure semiconductor laser diode as recited in claim 1, wherein said diode is a light emitting diode.

12. The heterostructure semiconductor laser diode as recited in claim 1, wherein said active region has a width ranging from 150 to 160 nanometers, and said upper and lower cladding layers have each a width ranging from 1500 to 2000 nanometers.

13. The heterostructure semiconductor laser diode as recited in claim 1, wherein said active region has a bandgap ranging from 0.95 to 1 eV., and each of said cladding layers has a bandgap approximately equal to 1.35 eV.

14. The heterostructure semiconductor laser diode as recited in claim 1, wherein said at least one tensile strained sublayer has a modulated strain profile with a $\Delta a/a$ ranging from $-0.73\%$ to $-0.9\%$.

15. The heterostructure semiconductor laser diode as recited in claim 1, wherein said at least one compressively strained sublayer has a modulated strain profile with a $\Delta a/a$ equal to 0.9%.

16. The heterostructure semiconductor laser diode as recited in claim 1, wherein said at least one tensile strained sublayer has a modulated strain profile with a $\Delta a/a$ ranging from $-0.73\%$ to $-0.9\%$ and said at least one compressively strained sublayer has a modulated strain profile with a $\Delta a/a$ equal to 0.9%, and providing said active region with a net layer strain with a $\Delta a/a$ approximately equal to zero.

17. The heterostructure semiconductor laser diode as recited in claim 1, wherein said alternating compressively strained and tensile strained sublayers are generated while growing said active region.

* * * * *